United States Patent
Liu et al.

(10) Patent No.: US 12,394,620 B2
(45) Date of Patent: Aug. 19, 2025

(54) BENZYL COMPOUND PASSIVATION FOR SELECTIVE DEPOSITION AND SELECTIVE ETCH PROTECTION

(71) Applicant: Applied Materials, Inc., Santa Clara, CA (US)

(72) Inventors: Feng Q. Liu, San Jose, CA (US); Mark J. Saly, Santa Clara, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 281 days.

(21) Appl. No.: 17/976,440

(22) Filed: Oct. 28, 2022

(65) Prior Publication Data

US 2024/0145232 A1    May 2, 2024

(51) Int. Cl.
  *H01L 21/02* (2006.01)
  *C23C 16/02* (2006.01)
  *C23C 16/34* (2006.01)
  *C23C 16/40* (2006.01)
  *C23C 16/455* (2006.01)

(52) U.S. Cl.
  CPC .... *H01L 21/02118* (2013.01); *C23C 16/0272* (2013.01); *C23C 16/34* (2013.01); *C23C 16/40* (2013.01); *C23C 16/45525* (2013.01); *H01L 21/02227* (2013.01); *H01L 21/0228* (2013.01)

(58) Field of Classification Search
  None
  See application file for complete search history.

(56) References Cited

U.S. PATENT DOCUMENTS

| | | | |
|---|---|---|---|
| 8,293,658 B2 | 10/2012 | Shero et al. | |
| 10,790,372 B2 | 9/2020 | Greene et al. | |
| 2016/0064275 A1* | 3/2016 | Liu | H01L 21/28562 438/608 |
| 2017/0342553 A1 | 11/2017 | Yu et al. | |
| 2018/0233350 A1* | 8/2018 | Tois | H01L 21/02181 |
| 2022/0130664 A1* | 4/2022 | Wang | H01L 21/32 |

FOREIGN PATENT DOCUMENTS

WO    2016033145 A1    3/2016

OTHER PUBLICATIONS

Suh, Taewon, et al., Applied Materials & Interfaces, "Competitive Adsorption as a Route to Area-Selective Deposition", www.acsami.org, ACS Appl. Mater. Interfaces 2020, 12, 9989-9999 Read, Downloaded via Oxiteno S.A.-Matriz on Sep. 6, 2022 at 20:10:35 (UTC), 11 pages.

(Continued)

*Primary Examiner* — Jose I Hernandez-Kenney
(74) *Attorney, Agent, or Firm* — Lowenstein Sandler LLP (57) ABSTRACT

A method includes forming a first layer and a second layer on a substrate, forming a passivation layer on a surface of the first layer without forming the passivation layer on a surface of the second layer by exposing the first layer and the second layer to a benzyl compound, and after forming the passivation layer on the first layer, performing at least one of: depositing a third layer on the second layer, or etching the second layer.

10 Claims, 4 Drawing Sheets

(56) References Cited

OTHER PUBLICATIONS

Chen, H.P., Taiwan Semiconductor Manufacturing Company, Hsinchu, Taiwan, "Fully Self-Aligned Via Integration for Interconnect Scaling Beyond 3nm Node", Authorized licensed use limited to: Applied Materials Inc. Downloaded on Sep. 6, 2022 at 20:32:35 UTC from IEEE Xplore. 4 pages.

Van Nguyen, Son, et al., 2021 IEEE International Interconnect Technology Conference(IITC) Jul. 6-9, 2021 Online, "Selective deposition of AlOx for Fully Aligned Via in nano Cu interconnects", 2 pages.

Lengers, Rik J., Eindhoven University of Technology, "Precursor Blocking Mechanisms of Aniline Inhibitor Molecules in Area-Selective Atomic Layer Deposition of TaN", Jul. 28, 2021, 87 pages.

Yarbrough, Josiah, et al., "Next generation nanopatterning using small molecule inhibitors for area-selective atomic layer deposition", J. Vac. Sci. Technol. A 39, 021002 (2021); https://doi.org/10.1116/6.0000840, Published Online: Mar. 3, 2021, 13 pages.

Huang, James, et al., Applied Materials & Interfaces, "Selective Pulsed Chemical Vapor Deposition of Water-Free $TiO_2/Al_2O_3$ and $HfO_2/Al_2O_3$ Nanolaminates on Si and $SiO_2$ in Preference to SiCOH", ACS Appl. Mater. Interfaces 2022, 14, 15716-15727, www.acsami.org, Downloaded via Univ of California San Diego on May 20, 2022 at 05:48:29 (UTC), 12 pages.

Cho, Ynil, et al., Applied Surface Science, "Inherent selective pulsed chemical vapor deposition of amorphous hafnium oxide / titanium oxide nanolaminates", www.elsevier.com/locate/apsusc, Available online Jun. 24, 2022, 10 pages.

Choi, Jon Youn, et al., Applied Surface Science, "Selective pulsed chemical vapor deposition of water-free HfOx on Si in preference to SiCOH and passivated $SiO_2$", www.elsevier.com/locate/apsusc, Available online Feb. 11, 2020, 10 pages.

Merkx, Marc J.M., "Area-Selective Atomic Layer Deposition of TiN Using Aromatic Inhibitor Molecules for Metal/ Dielectric Selectivity", Chem. Mater. 2020, 32, 7788-7795, Downloaded via Oxiteno S.A.-Martiz on Aug. 25, 2022 at 20:44:27 (UTC), 8 pages.

Braendle, Andreas, et al., Synthesis of High Molar Mass Poly(phenylene methylene) Catalyzed by Tungsten(II) Compounds, Polymers 2018, 10, 881; doi:10.3390/polym10080881 www.mdpi.com/journal/polymers, Published: Aug. 7, 2018, 13 pages.

Inga Olliges-Stadler, Marta D. Rossell, and Markus Niederberger, "Co-operative Formation of Monolithic Tungsten Oxide-Polybenzylene Hybrids via Polymerization of Benzyl Alcohol and Study of the Catalytic Activity of the Tungsten Oxide Nanoparticles", Published online: Mar. 30, 2010, 7 pages.

International Search Report and Written Opinion for International Application No. PCT/US2023/036031, mailed Feb. 21, 2024, 8 Pages.

* cited by examiner

BENZYL COMPOUND PASSIVATION FOR SELECTIVE DEPOSITION AND SELECTIVE ETCH PROTECTION

TECHNICAL FIELD

Embodiments of the present disclosure generally relate to electronic device fabrication. Particularly, embodiments of the present disclosure relate to benzyl compound passivation for selective deposition and selective etch protection.

BACKGROUND

An electronic device manufacturing apparatus can include multiple chambers, such as process chambers and load lock chambers. Such an electronic device manufacturing apparatus can employ a robot apparatus in the transfer chamber that is configured to transport substrates between the multiple chambers. In some instances, multiple substrates are transferred together. Process chambers may be used in an electronic device manufacturing apparatus to perform one or more processes on substrates, such as deposition processes and etch processes. For many processes gases are flowed into the process chamber. Electronic devices such as semiconductor devices are manufactured by performing a series of operations that may include deposition, oxidation, photolithography, ion implantation, etch, and so on to form many patterned layers.

SUMMARY

In accordance with an embodiment, a method is provided. The method includes forming a first layer and a second layer on a substrate, forming a passivation layer on a surface of the first layer without forming the passivation layer on a surface of the second layer by exposing the first layer and the second layer to a benzyl compound, and after forming the passivation layer on the first layer, performing at least one of: depositing a third layer on the second layer, or etching the second layer.

In accordance with an embodiment, a system including at least one chamber is provided. The at least one chamber is configured to form a passivation layer on a surface of the first layer without forming the passivation layer on a surface of the second layer by exposing the first layer and the second layer to a benzyl compound. The first layer and the second layer are formed on a substrate. The at least one chamber is further configured to, after forming the passivation layer, perform at least one of: depositing a third layer on the second layer using a deposition process, or etching the second layer.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Embodiments described herein relate to benzyl compound passivation for selective deposition and selective etch protection. An electronic device can include a number of different types of layers. For example, an electronic device can include dielectric layers formed from a dielectric material, conductive layers formed from a conductive material, and semiconductor layers formed from a semiconductor material. Electronic device processing techniques can involve performing patterning (e.g., photolithography) to create structures (e.g., trenches for conductive lines and/or holes for vias). For example, patterning can include multiple and repetitive processes of deposition and etching, such as wet etching or dry etching (e.g., plasma etching), with photomasks ("masks") and resist films.

Some electronic devices can include a first layer and a second layer each disposed on a substrate, and possibly additional layers. For example, the first layer can be disposed adjacent to the second layer. The first and second layer may each be exposed layers in embodiments. The first layer can include a first material, and the second layer can include a second material different from the first material. There may be situations during electronic device fabrication in which a third layer should be selectively deposited on the second layer in preference to the first layer (i.e., without being deposited on the first layer). That is, it is not desirable to form the material on the first layer. Alternatively, there may be situations during electronic device fabrication is which the second layer should be selectively etched in preference to the first layer. That is, it is not desirable to etch the first layer. However, as electronic device sizes get smaller (e.g., on the nanometer scale), it is becoming more difficult to enable selective deposition of material on the second layer and/or selective etching of the second layer relative to the first layer.

To address these and other drawbacks, embodiments described herein can enable benzyl compound passivation for selective deposition and selective etch protection. More specifically, a first layer and a second layer can be disposed on a substrate (e.g., the first layer can be adjacent to the second layer). The first layer can include a material that, when exposed to a suitable passivant, can form a passivation layer on the surface of the first layer. The second layer can be formed from a material that, when exposed to the same passivant, does not form a passivation layer.

For example, the passivant can include a benzyl compound. In some embodiments, the benzyl compound includes benzyl alcohol. Benzyl alcohol is an aromatic alcohol molecule that can include a benzyl group ($C_6H_5CH_2$—) attached to a hydroxy functional group (—OH). More specifically, the benzyl group can be formed by attaching a benzene ring ($C_6H_6$) to a $CH_2$ group. Thus, benzyl alcohol can be represented by the formulas $C_6H_5CH_2OH$, $C_7H_8O$, or BnOH, where "Bn" refers to the benzyl group. In some embodiments, the benzyl compound includes a benzyl alcohol derivative. More specifically, a benzyl alcohol derivative can be of the form $RC_6H_4CH_2OH$. For example, $R=C_1$ through $C_{10}$.

In some embodiments, the benzyl compound includes a benzyl halide. A benzyl halide is a halocarbon compound (e.g., organofluorine compound, organochlorine compound, organobromine compound, or organoiodine compound) that can include a benzyl group ($C_6H_5CH_2$—) attached to a halogen. For example, the benzyl compound can be benzyl chloride, which is an organochlorine compound that can include the benzyl group attached to chlorine (—Cl). In some embodiments, the benzyl compound includes a benzyl halide derivative (e.g., benzyl chloride derivative). More specifically, a benzyl halide derivative can be of the form $RC_6H_4CH_2$. For example, $R=C_1$ through $C_{10}$.

The first layer and the second layer can each include a respective material such that, during the benzyl compound exposure, the surface of the first layer can cause the catalytic polymerization of the benzyl compound while the surface of the second layer does not cause the catalytic polymerization of the benzyl compound. That is, the polymerization of the benzyl compound is highly selective with respect to the surface of the first layer.

For example, the first layer can include a dielectric material. In some embodiments, the first layer includes a native oxide formed on a conductive material. For example, the first layer can be a metal oxide (e.g., transition metal oxide) formed from a metal (e.g., transition metal). Examples of suitable dielectric materials that can form the first layer include a tungsten oxide (e.g., $WO_2$, $WO_3$, $W_2O_3$, or $W_2O_5$), a molybdenum oxide (e.g., $MoO_2$ or $MoO_3$), a manganese oxide (e.g., $MnO$, $MnO_2$, $MnO_3$, $Mn_2O_3$, $Mn_3O_4$, $Mn_2O_7$, $Mn_5O_8$, $Mn_7O_{12}$, or $Mn_7O_{13}$), a nickel oxide (e.g., $NiO$ or $Ni_2O_3$), a nickelate, etc.

In some embodiments, the second layer includes a dielectric material. For example, the second layer can include an oxide. Illustratively, the oxide can be a silicon oxide or a metal oxide (e.g., transition metal oxide). For example, the metal oxide can be different from the metal oxide used to form the first layer. As another example, the second layer can include a nitride. Illustratively, the nitride can be a silicon nitride or a metal nitride (e.g., transition metal nitride). Examples of suitable dielectric materials that can be used to form the second layer include silicon dioxide ($SiO_2$), carbon-doped silicon oxides (e.g., $SiOC$, $SiCOH$), silicon nitride ($Si_3N_4$), aluminum oxide ($Al_2O_3$), aluminum nitride (AlN), etc. In some embodiments, the second layer includes a conductive material. For example, the second layer can include a metal. Illustratively, the conductive material can include cobalt (Co), copper (Cu), silver (Ag), tungsten (W), molybdenum (Mo), etc.

The catalytic polymerization of the benzyl compound by the first layer forms a passivation layer including a polymer that adsorbs to the surface of the first layer. In some embodiments, the passivation layer includes poly(phenylene methylene) (PPM). PPM is a hydrocarbon polymer that includes a number of monomers, where each monomer includes a phenylene unit ($C_6H_4$—) and a methylene unit (—$CH_2$). Thus, PPM can be presented by the formula $(C_6H_4[CH_2])_n$. Polymerizing the benzyl compound into PPM can include transforming a residue of the benzyl compound into dibenzyl ether $(C_6H_5CH_2)_2O$, which can then polymerize into PPM.

In some embodiments, the passivation is performed in-situ. In some embodiments, the passivation is performed ex-situ. The process to form the passivation layer can include performing a number of cycles. Each cycle can include steps of pulsing the benzyl compound, performing a soak, and performing a purge. Each step of the cycle can be performed using any suitable process parameters. The process parameters can control the thickness of the passivation layer. Examples of process parameters for performing the passivation include temperature, pressure, number of cycles, pulse time (i.e., the length of time for each monomer), purge time (i.e., the length of time that a purge gas is introduced between pulses), etc. Further details regarding forming the passivation layer will be described below with reference to FIG. 1.

In some embodiments, a cleaning process is performed prior to passivating the conductive material (i.e., precleaning). The precleaning process can be optionally performed to improve the selectivity of the passivation layer on the surface of the first layer and/or decrease the deposition of the passivation layer on the surface of the second layer. For example, the precleaning process can remove contaminants from the surface of the first layer and/or can reduce defect growth on the conductive material. For example, the precleaning process can include a thermal moisture treatment, a hydrogen treatment, a water vapor treatment, an oxygen dosing treatment, etc. Further details regarding the precleaning process will be described below with reference to FIG. 1.

After the passivation (and optional precleaning before the passivation), at least one processing step can be performed. More specifically, the passivation layer can function as a barrier layer during the at least one processing step.

In some embodiments, the at least one processing step includes deposition of a third layer on the surface of the second layer. More specifically, the passivation layer enables selective deposition of the third layer on the surface of the second layer in preference to the passivation layer by preventing (e.g., blocking) the adsorption of deposition precursors during a subsequent deposition process to form the third layer (i.e., prevent nucleation of the deposition precursors). This can prevent (e.g., inhibit) the formation of the third layer on the passivation layer. The third layer can be deposited on the surface of the second layer to a target thickness (e.g., by performing a suitable number of deposition cycles).

The third layer can include any suitable material. In some embodiments, the third layer includes a dielectric material. The third layer can include any suitable dielectric material. In some embodiments, the third layer includes a nitride (e.g., metal nitride). Examples of suitable nitrides that can be used to form the third layer include tantalum nitride (TaN), titanium nitride (TiN), molybdenum nitride (MoN), tungsten nitrides (e.g., WN, $W_2N$, $WN_2$), a manganese nitride (MnN, $Mn_3N_2$), etc. In some embodiments, the third layer includes an oxide. Examples of suitable oxides that can be used to form the third layer include $Al_2O_3$, $SiO_2$, hafnium dioxide ($HfO_2$), titanium dioxide ($TiO_2$), zirconium dioxide ($ZrO_2$), vanadium oxides (e.g., VO, $VO_2$, $V_2O_3$, $V_2O_5$), niobium oxides (e.g., NbO, $NbO_2$, $Nb_2O_5$), tantalum pentoxide ($Ta_2O_5$), tungsten oxides (e.g., $WO_2$, $WO_3$, $W_2O_3$, $W_2O_5$), molybdenum oxides (e.g., $MoO_2$, $MoO_3$), etc. In some embodiments, the third layer includes a conductive material. The third layer can include any suitable conductive material. Examples of suitable conductive materials include cobalt (Co), copper (Cu), silver (Ag), tungsten (W), molybdenum (Mo), etc.

The deposition process can be any suitable deposition process. In some embodiments, the deposition process is an ALD process. In some embodiments, the deposition process is a chemical vapor deposition (CVD) process. The deposition process can utilize any suitable deposition precursors and any suitable process parameters. For example, if the third layer includes a metal oxide, then the deposition process can utilize a metal oxide precursor (e.g., metal alkoxide precursor). As another example, if the third layer includes a conductive material (e.g., metal), then the deposition process can utilize a conductive material precursor (e.g., metal precursor). The process parameters of the deposition process (e.g., CVD process or thermal ALD process) can depend on the deposition precursor(s) used to form the second layer, and the target thickness of the resulting second layer.

In some embodiments, the at least one processing step includes etching the second layer. The passivation layer can enable selective etch protection of the surface of the first layer during etching of the second layer. More specifically, the passivation layer can be resistant to a particular etch chemistry used to etch the second layer. For example, if the etch process is a dry etch process, then the etch chemistry can include nitrogen trifluoride ($NF_3$) gas to generate $NF_3$ plasma. Further details regarding benzyl compound passivation for selective deposition and selective etch protection will now be described below with reference to FIG. 1.

Figure 1:
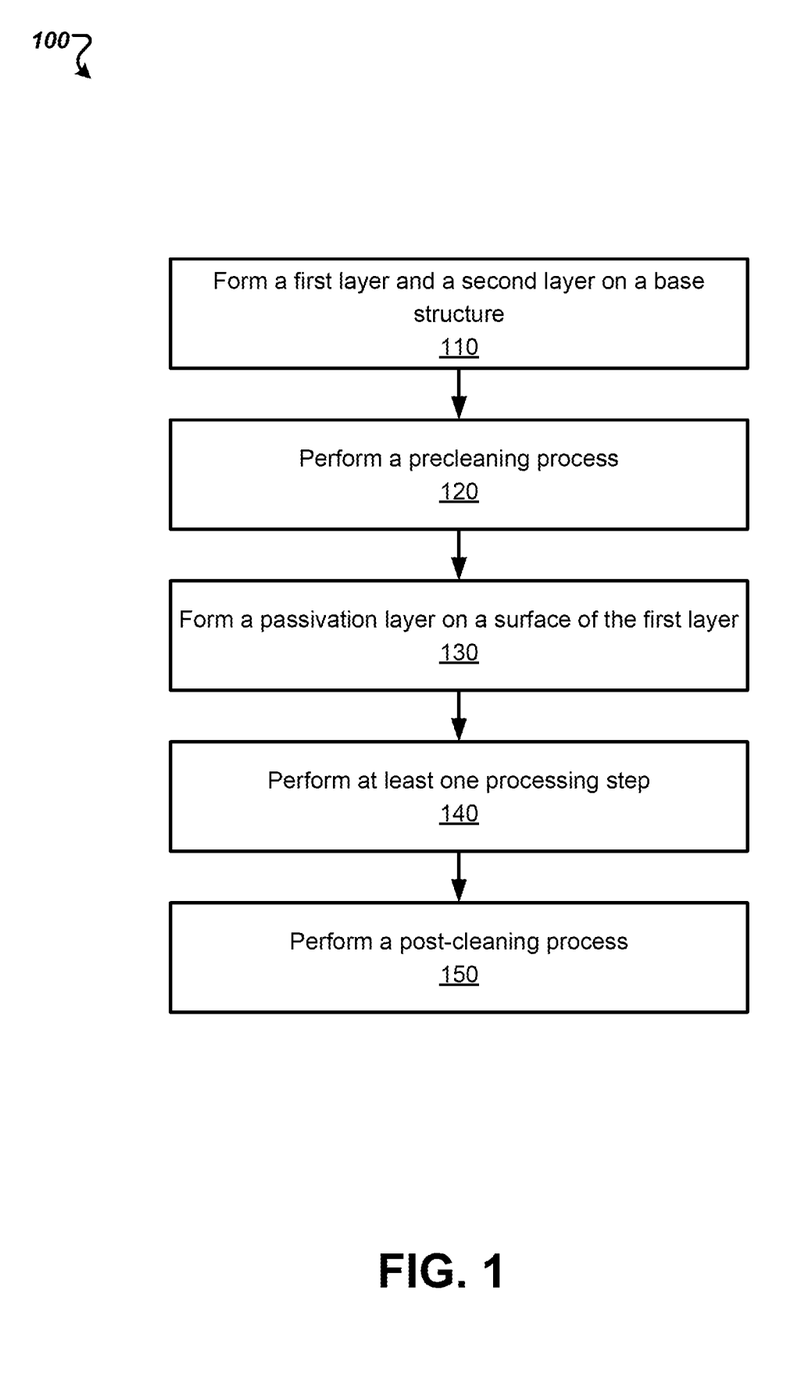
FIG. 1 is a flowchart of an example method of implementing benzyl compound passivation for selective deposition and selective etch protection, in accordance with some embodiments.

FIG. 1 depicts an example method 100 of implementing benzyl compound passivation for selective deposition and selective etch protection, in accordance with some embodiments. The method 100 can be performed within an electronic device processing system. More specifically, the method 100 can be performed within one or more process chambers of the electronic device processing system. Further details regarding the electronic device processing system will be described below with reference to FIG. 2.

At step 110, a base structure of a device including a first layer and a second layer is formed. The first layer can include a first material, and the second layer can include a second material different from the first material. In some embodiments, the first layer is formed adjacent to the second layer. For example, the first layer and the second layer can be formed on a substrate. For example, substrate can be an initial layer of the device. The substrate can include any suitable material in accordance with embodiments described herein. In some embodiments, the substrate is a silicon (Si)) substrate.

The first layer and the second layer can each be formed from a respective material such that, during subsequent exposure to a benzyl compound, the first layer can cause the catalytic polymerization of the benzyl compound while the second layer does not cause the catalytic polymerization of the benzyl compound. That is, the polymerization of the benzyl compound is highly selective with respect to the first layer.

The first layer can include a dielectric material. In some embodiments, the first layer includes a native oxide formed on a conductive material. For example, the first layer can be a metal oxide (e.g., transition metal oxide) formed from a metal (e.g., transition metal). Examples of suitable dielectric materials that can be used to form the first layer include a tungsten oxide (e.g., $WO_2$, $WO_3$, $W_2O_3$, or $W_2O_5$), a molybdenum oxide (e.g., $MoO_2$ or $MoO_3$), a ruthenium oxide (e.g., $RuO_2$ or $RuO_4$), a manganese oxide (e.g., $MnO$, $MnO_2$, $MnO_3$, $Mn_2O_3$, $Mn_3O_4$, $Mn_2O_7$, $Mn_5O_8$, $Mn_7O_{12}$, or $Mn_7O_{13}$), a nickel oxide (e.g., $NiO$ or $Ni_2O_3$), a nickelate, etc.

In some embodiments, the second layer includes a dielectric material. For example, the second layer can include an oxide. Illustratively, the oxide can be a silicon oxide or a metal oxide (e.g., transition metal oxide). As another example, the second layer can include a nitride. Illustratively, the nitride can be a silicon nitride or a metal nitride (e.g., transition metal nitride). Examples of suitable dielectric materials that can be used to form the second layer include $SiO_2$, carbon-doped silicon oxides (e.g., SiOC, SiCOH), $Si_3N_4$, $Al_2O_3$, AlN, etc. In some embodiments, the second layer includes a conductive material. For example, the second layer can include a metal. Illustratively, the conductive material can include Co, Cu, Ag, W, Mo, etc.

At step 120, an optional precleaning process is performed. More specifically, the base structure including the first layer and the second layer can be cleaned. The precleaning process can be optionally performed to improve the selectivity of the passivation layer on the surface of the first layer and/or decrease the deposition of the passivation layer on the surface of the second layer. For example, the precleaning process can remove contaminants from the surface of the first layer and/or can reduce defect growth on the conductive material. For example, the precleaning process can include a thermal moisture treatment, a hydrogen treatment, a water vapor treatment, an oxygen dosing treatment, etc.

The precleaning process can be performed using any suitable process parameters. Examples of process parameters for performing the precleaning include amount of time, temperature, pressure, etc. For example, the thermal moisture treatment can be performed for a time ranging from about 0.2 seconds (s) to about 10 s and at a temperature ranging from about 200° C. to about 300° C. (e.g., about 250° C.). In some embodiments, the pressure ranges from about 100 millitorr (mTorr) to about 10 torr. In some embodiments, the pressure ranges from about 500 mTorr to about 10 torr. In some embodiments, the pressure ranges from about 1 torr to about 10 torr.

At step 130, a passivation layer is formed on a surface of the first layer. More specifically, forming the passivation layer can include exposing the first layer to a benzyl compound. The benzyl compound can react strongly to the first layer to form a passivation layer that adsorbs to the surface of the first layer. In some embodiments, the first conductive material is exposed to benzyl alcohol during a single passivation process. In some embodiments, the benzyl compound includes benzyl alcohol. In some embodiments, the benzyl compound includes a benzyl alcohol derivative. In some embodiments, the benzyl compound includes a benzyl halide. For example, the benzyl halide can include benzyl chloride. In some embodiments, the benzyl compound includes a benzyl halide derivative.

More specifically, the first layer can enable catalytic polymerization of the benzyl compound to form the passivation layer, where the passivation layer includes a polymer that adsorbs to the surface of the first layer. In some embodiments, the passivation layer includes PPM. For example, polymerizing the benzyl compound into PPM can include transforming a residue of the benzyl compound into dibenzyl ether, which can then polymerize into PPM.

In some embodiments, the passivation layer is formed in-situ. In some embodiments, the passivation layer is formed ex-situ. The passivation layer formation can be performed using any suitable process parameters. The process parameters can control the thickness of the passivation layer. Examples of process parameters for performing the passivation include temperature, pressure, cycles, pulse time (i.e., the length of time for each monomer), purge time (i.e., the length of time that a purge gas is introduced between pulses), etc.

For example, forming the passivation layer can include pulsing the benzyl compound for a suitable pulse time and at a suitable pressure. In some embodiments, the benzyl compound is pulsed with a pulse time ranging from about 0.1 s to about 10 s at a pressure ranging from about 500 mTorr to about 50 torr. In some embodiments, the benzyl compound is pulsed with a pulse time ranging from about 2 s to about 5 s at a pressure ranging from about 1 torr to about 5 torr. In some embodiments, the benzyl compound is pulsed with a pulse time of about 3 s at a pressure of about 1.8 torr.

Forming the passivation layer can further include, after pulsing the benzyl compound, performing a soak for a suitable soak time and at a suitable pressure. In some embodiments, soaking is performed at a soak time ranging from about 1 s to about 40 s at a pressure ranging from about 500 mTorr to about 50 torr. In some embodiments, soaking is performed at a soak time ranging from about 10 s to about 30 s at a pressure ranging from about 1 torr to about 5 torr. In some embodiments, soaking is performed at a soak time of about 20 s at a pressure of about 1.8 torr.

Forming the passivation layer can further include, after performing the soak, performing a purge for a suitable soak time and at a suitable pressure. The purge can be performed using any suitable purge gas (e.g., Ar or $N_2$). In some embodiments, purging is performed at a purge time ranging from about 1 s to about 20 s at a pressure ranging from about 500 mTorr to about 10 torr. In some embodiments, purging is performed at a purge time ranging from about 5 s to about 15 s at a pressure ranging from about 1 torr to about 5 torr. In some embodiments, purging is performed at a purge time of about 10 s at a pressure of about 0.8 torr.

The above-described steps constitute a single cycle. Each step of the cycle can be performed at a suitable temperature. In some embodiments, the temperature ranges from about 100° C. to about 400° C. In some embodiments, the temperature ranges from about 300° C. to about 375° C. In some embodiments, the temperature is of about 350° C.

Any suitable number of cycles can be performed to achieve a suitable passivation layer thickness. In some embodiments, the thickness of the passivation layer can range from about 0.5 nanometer (nm) to about 100 nm. In some embodiments, the number of cycles ranges from about 1 cycle to about 50 cycles. In some embodiments, the number of cycles ranges from about 15 cycles to about 35 cycles. In some embodiments, the number of cycles is about 20 cycles.

At step 140, at least one processing step is performed. More specifically, the at least one processing step can be performed after forming the passivation layer (and optional precleaning before forming the passivation layer). The passivation layer can function as a barrier layer during the at least one processing step.

In some embodiments, the at least one processing step includes deposition of a third layer on the surface of the second layer. More specifically, the passivation layer enables selective deposition of the third layer on the surface of the second layer in preference to the passivation layer by preventing (e.g., blocking) the adsorption of deposition precursors during a subsequent deposition process to form the third layer (i.e., prevent nucleation of the deposition precursors). This can prevent (e.g., inhibit) the formation of the third layer on the passivation layer. The third layer can be deposited on the surface of the second layer to a target thickness (e.g., by performing a suitable number of deposition cycles).

The third layer can include any suitable material. In some embodiments, the third layer includes dielectric material. The third layer can include any suitable dielectric material. In some embodiments, the third layer includes a nitride (e.g., metal nitride). Examples of suitable nitrides that can be used to form the third layer include TaN, TiN, MoN, tungsten nitrides (e.g., WN, $W_2N$, $WN_2$), a manganese nitride (MnN, $Mn_3N_2$), etc. In some embodiments, the third layer includes an oxide. Examples of suitable oxides that can be used to form the third layer include $Al_2O_3$, $SiO_2$, $HfO_2$, $TiO_2$, $ZrO_2$, vanadium oxides (e.g., VO, $VO_2$, $V_2O_3$, $V_2O_5$), niobium oxides (e.g., NbO, $NbO_2$, $Nb_2O_5$), $Ta_2O_5$, tungsten oxides (e.g., $WO_2$, $WO_3$, $W_2O_3$, $W_2O_5$), molybdenum oxides (e.g., $MoO_2$, $MoO_3$), etc. In some embodiments, the third layer is a conductive layer. The third layer can include any suitable conductive material. Examples of suitable conductive materials include Co, Cu, Ag, W, Mo, etc.

The deposition process can be any suitable deposition process. In some embodiments, the deposition process is an ALD process. In some embodiments, the deposition process is CVD process. The deposition process can utilize any suitable deposition precursors and any suitable process parameters. For example, if the third layer includes a metal oxide, then the deposition process can utilize a metal oxide precursor (e.g., metal alkoxide precursor). As another example, if the third layer includes a conductive material (e.g., metal), then the deposition process can utilize a conductive material precursor (e.g., metal precursor). The process parameters of the deposition process (e.g., ALD process or CVD process) can depend on the deposition precursor(s) used to form the third layer, and the target thickness of the resulting third layer.

In some embodiments, the at least one processing step includes etching the second layer. The passivation layer can be resistant to a particular etch chemistry used to etch the second layer, thereby enabling selective etch protection of the first layer during etching of the second layer.

At step 150, an optional post-cleaning process can be performed. More specifically, the post-cleaning process can be performed after forming the third layer. Performing the post-cleaning process can include removing the passivation layer from surface of the first layer. As another example, performing the post-cleaning process can further include removing defects.

Figure 2:
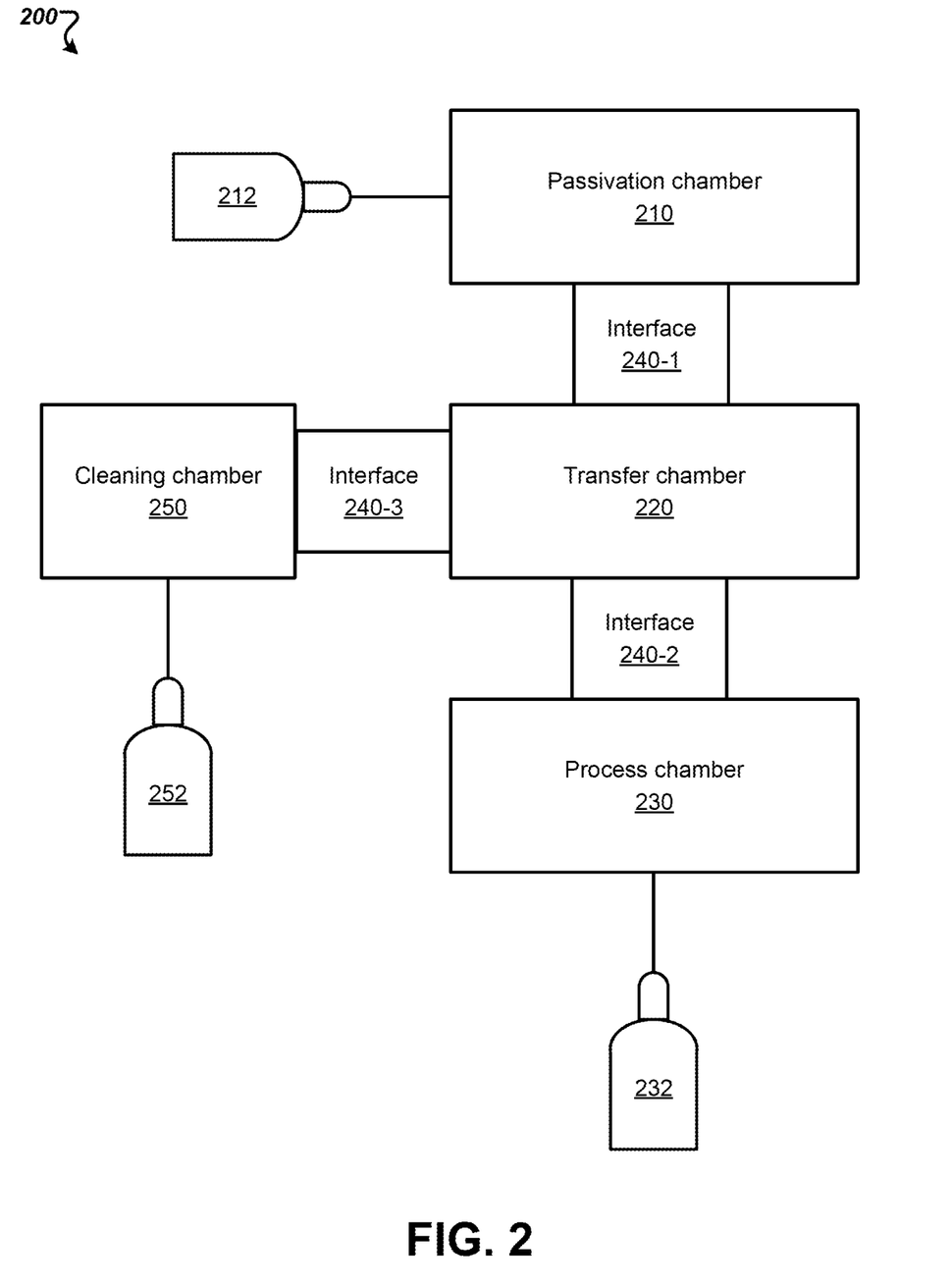
FIG. 2 is a block diagram of an example electronic device processing system that can be used to implement benzyl compound passivation for selective deposition and selective etch protection, in accordance with some embodiments.

FIG. 2 is a block diagram of an example electronic device processing system ("system") 200 that can be used to implement benzyl compound passivation for selective deposition and selective etch protection, in accordance with some embodiments. For example, the system 200 can be used to implement the method 100 described above with reference to FIG. 1.

As shown, the system 200 includes a passivation chamber 210, a transfer chamber 220, and at least one process chamber 230. An interface 240-1 can be disposed between the passivation chamber 210 and the transfer chamber 220, and an interface 240-2 can be disposed between the transfer chamber and the process chamber 230. In some embodiments, the interfaces 240-1 and 240-2 are respective gate valves. The transfer chamber 220 can include a transfer robot (not shown). In some embodiments, the process chamber 230 is a deposition chamber. In some embodiments, the process chamber 230 is an etch chamber.

The transfer chamber 220, passivation chamber 210, and process chamber 230 may each be maintained under vacuum in controlled conditions (e.g., with little or no humidity). Although not shown, the system 200 can further include at least one load lock chamber and at least one factory interface to enable the movement of substrates from atmosphere to the transfer chamber 220. Accordingly, substrates may be transferred between chambers without breaking vacuum, and thus without exposing a substrate to air and/or humidity.

The passivation chamber 210 can receive a substrate including a first layer and a second layer, and form a passivation layer on the first layer by exposing the first layer to a benzyl compound (e.g., benzyl alcohol or benzyl chloride). The passivation chamber 210 can be operatively coupled to at least one passivation gas store 212. For example, the at least one passivation gas store 212 can include a benzyl compound store. The at least one passivation gas store 212 can further include a purge gas store. The purge gas store can include any suitable inert gas for purging the passivation chamber 212 during the passivation process (e.g., Ar or $N_2$). The passivation process can be performed using any suitable passivation process parameters. Further details regarding forming the passivation layer are described above with reference to FIG. 1.

After forming the passivation layer on the surface of the first layer, the transfer robot can transfer the substrate to the process chamber 230. After receiving the substrate, the process chamber 230 can perform at least one process. For example, the at least one process can include a deposition process to form a third dielectric layer selectively on the surface of the second layer. In some embodiments, the deposition process is a CVD process. In some embodiments, the deposition process is an ALD process. As another example, the at least one process can include an etch process to etch the second layer. In some embodiments, the etch process is a dry etch process.

The process chamber 230 can be operatively coupled to at least one process gas store 232. For example, the at least one process gas store 232 can include a deposition precursor store to perform the deposition process. The deposition precursor store can include any suitable deposition precursor(s) for forming the third layer. As another example, the at least one process gas store 232 can include an etch precursor store to perform the etch process. The etch precursor store can include any suitable etch precursor(s) for etching the second layer. As yet another example, the at least one process gas store 232 can include a purge gas store. The purge gas store can include any suitable inert gas for purging the process chamber 230 (e.g., Ar or $N_2$). The deposition and/or etch process can be performed using any suitable process parameters. Further details regarding performing the deposition process and/or the etch process are described above with reference to FIG. 1.

In some embodiments, the deposition process and/or the etch process is performed in the passivation chamber 210 (i.e., the passivation chamber 210 is a process chamber configured to perform the passivation process and the deposition process and/or etch process). In these embodiments, the at least one process gas store 232 can be operatively coupled to the passivation chamber 210. In some embodiments, the passivation process is performed in the process chamber 230 (i.e., the process chamber 230 is a process chamber configured to perform the passivation process and the deposition process and/or etch process). In these embodiments, the at least one passivation gas store 212 can be operatively coupled to the process chamber 230.

In some embodiments, the system 200 can optionally include a cleaning chamber 250 to perform an optional cleaning process before passivation (i.e., precleaning process) and/or an optional cleaning process after the formation of the second layer (i.e., post-cleaning process). An interface 240-3 can be disposed between the cleaning chamber 250 and the transfer chamber 220. In some embodiments, the cleaning chamber 250 is an in-situ cleaning chamber, and the interface 240-3 is a gate valve. In some embodiments, the cleaning chamber 250 is an ex-situ cleaning chamber, and the interface 240-3 is a load lock chamber. The precleaning process and/or the post-cleaning process can be performed using any suitable precleaning process parameters.

For example, performing the post-cleaning process can include heating the device to a temperature greater than or equal to 350° C. As another example, performing the post-cleaning process can further include removing defects (e.g., portions of dielectric material that may have formed on the conductive material during the deposition process). As another example, the post-cleaning process can be a plasma cleaning process. As yet another example, the post-cleaning process can be a remote plasma cleaning process. The post-cleaning process can be performed using any suitable post-cleaning process parameters.

The cleaning chamber 250 can be operatively coupled to at least one cleaning gas store 252. The at least one cleaning gas store 252 can include a suitable cleaning chemistry. The at least one cleaning gas store 252 can further include a purge gas store. The purge gas store can include any suitable inert gas for purging the cleaning chamber 252 during the passivation process (e.g., Ar or $N_2$).

In some embodiments, the precleaning process can be performed in the same chamber as passivation (e.g., the passivation chamber 210 or the at least one process chamber 230). In these embodiments, the at least one cleaning gas store 252 can be operatively coupled to the passivation chamber 3210 and/or the at least one process chamber 230. In some embodiments, the post-cleaning process can be performed in the passivation chamber 210 and/or the at least one process chamber 230. In these embodiments, the at least one cleaning gas store 252 can be operatively coupled to the passivation chamber 210 and/or the at least one process chamber 230. Further details regarding performing cleaning processes (e.g., precleaning process and/or post-cleaning process) are described above with reference to FIG. 1.

Figure 3A:
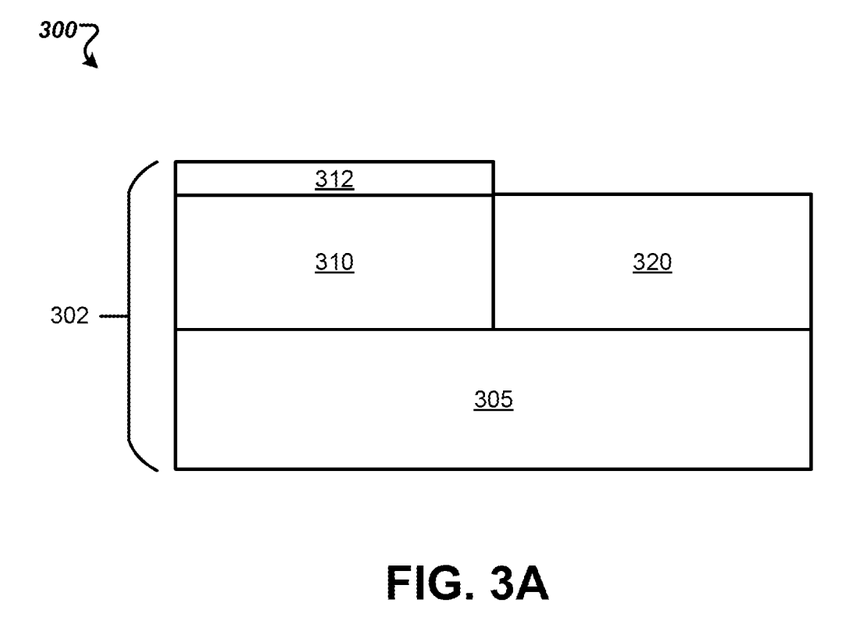
FIGS. 3A-3D are diagrams of cross-sectional views of an example fabrication of a device implementing benzyl compound passivation for selective deposition and selective etch protection, in accordance with some embodiments.

FIGS. 3A-3D are diagrams of cross-sectional views of an example fabrication of a device 300 implementing benzyl compound passivation for selective deposition and selective etch protection, in accordance with some embodiments. As shown in FIG. 3A, the device 300 can include a base structure 302 including substrate 305, a layer 310 disposed on the substrate 305, and layer 320 disposed on the substrate 305 adjacent to the conductive layer. The substrate 305 can include at least one layer including a substrate layer (e.g., Si substrate layer). The at least one layer of the substrate 305 can further include one or more additional layers disposed between the substrate layer 305 and the layers 310 and 320.

The layer 310 can include any suitable conductive material. For example, the layer 310 can include a metal (e.g., transition metal). Examples of suitable transition metals include W, Mo, Ru, Mn, Ni, etc. In some embodiments, the layer 320 includes a dielectric material. The layer 320 can include any suitable dielectric material. For example, the layer 320 can include an oxide. Illustratively, the oxide can be a silicon oxide or a metal oxide (e.g., transition metal oxide). As another example, the second layer can include a nitride. Illustratively, the nitride can be a silicon nitride or a metal nitride (e.g., transition metal nitride). Examples of suitable dielectric materials that can be used to form the dielectric layer 320 include $SiO_2$, carbon-doped silicon oxides (e.g., SiOC, SiCOH), $Si_3N_4$, $Al_2O_3$, AlN, etc. In some embodiments, the layer 320 includes a conductive material. For example, the second layer can include a metal. Illustratively, the conductive material can include Co, Cu, Ag, W, Mo, etc.

As further shown, a native oxide layer 312 can form on the layer 310. For example, the first layer can be a metal oxide (e.g., transition metal oxide). Illustratively, if the layer 310 includes W, then the native oxide layer 312 can include a tungsten oxide (e.g., $WO_2$, $WO_3$, $W_2O_3$, or $W_2O_5$). If the layer 310 includes Mo, then the native oxide layer 312 can include a molybdenum oxide (e.g., $MoO_2$ or $MoO_3$). If the layer 310 includes Mn, then the native oxide layer 312 can include a manganese oxide (e.g., MnO, $MnO_2$, $MnO_3$, $Mn_2O_3$, $Mn_3O_4$, $Mn_2O_7$, $Mn_5O_8$, $Mn_7O_{12}$, or $Mn_7O_{13}$). If the layer 310 includes Mo, then the native oxide layer 312 can include a nickel oxide (e.g., NiO or $Ni_2O_3$) or nickelate. Further details regarding forming the base structure 302 are described above with reference to FIGS. 1-2.

Figure 3B:
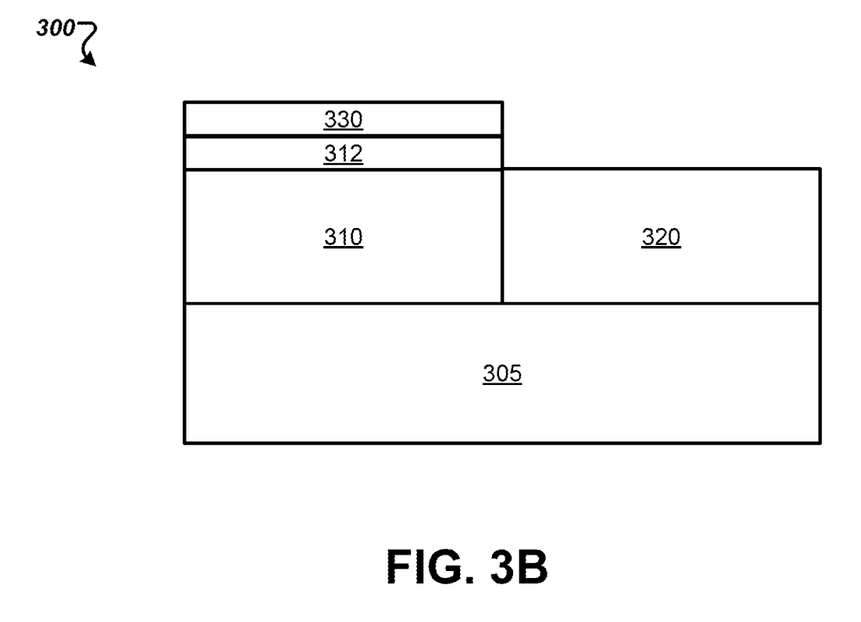

As shown in FIG. 3B, as passivation layer 330 is formed on the surface of the native oxide layer 312. More specifically, forming the passivation layer 330 can include exposing the native oxide layer 312 to a benzyl compound. The benzyl compound can react strongly to the native oxide layer 312 to form the passivation layer 330, which adsorbs to the surface of the native oxide layer 312. In some embodiments, the benzyl compound includes benzyl alcohol. In some embodiments, the benzyl compound includes a benzyl alcohol derivative. In some embodiments, the benzyl compound includes a benzyl halide. For example, the benzyl halide can include benzyl chloride. In some embodiments, the benzyl compound includes a benzyl halide derivative.

More specifically, the native oxide 312 can enable catalytic polymerization of the benzyl compound to form the passivation layer 330 including a polymer. In some embodiments, the passivation layer 330 includes PPM. The native oxide 312 can be exposed to the benzyl compound for any suitable number of passivation processes to achieve a desired passivation layer thickness. In some embodiments, the native oxide 312 is exposed to benzyl compound during a single passivation process. Further details regarding forming the passivation layer 330 are described above with reference to FIGS. 1-2.

Figure 3C:
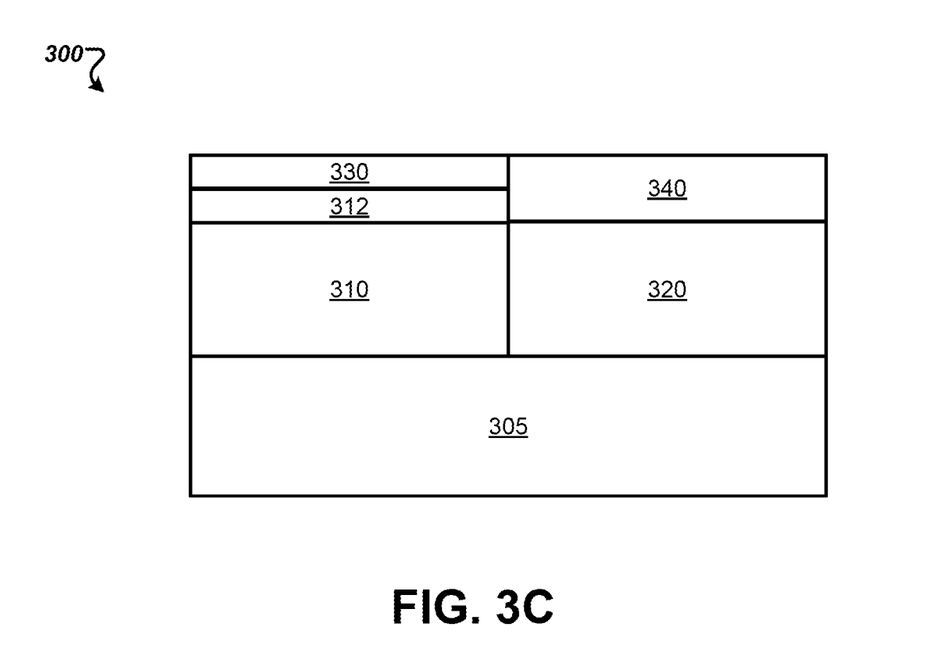

After the passivation layer 330 is formed, at least one processing step can be performed using the passivation layer 330 as a barrier layer. In some embodiments, as shown in FIG. 3C, the at least one processing step includes depositing a layer 340 on the surface of the layer 320. More specifically, the passivation layer enables selective deposition of the layer 340 on the surface of the layer 320 in preference to the passivation layer 330. More specifically, the passivation layer can prevent (e.g., block) the adsorption of deposition precursors during the deposition process to form the layer 340 (i.e., prevent nucleation of the deposition precursors). This can prevent (e.g., inhibit) the formation of the third layer on the passivation layer. The third layer can be deposited on the surface of the second layer to a target thickness (e.g., by performing a suitable number of deposition cycles).

The layer 340 can include any suitable material. In some embodiments, the layer 340 includes a dielectric material. The layer 340 can include any suitable dielectric material. In some embodiments, the third layer can include a nitride (e.g., metal nitride). Examples of suitable nitrides that can be used to form the layer 340 include TaN, TiN, MoN tungsten nitrides (e.g., WN, $W_2N$, $WN_2$), a manganese nitride (e.g., MnN, $Mn_3N_2$) etc. In some embodiments, the layer 340 includes an oxide. Examples of suitable oxides that can be used to form the layer 340 include $Al_2O_3$, $SiO_2$, $HfO_2$, $TiO_2$, $ZrO_2$, vanadium oxides (e.g., VO, $VO_2$, $V_2O_3$, $V_2O_5$), niobium oxides (e.g., NbO, $NbO_2$, $Nb_2O_5$), $Ta_2O_5$, tungsten oxides (e.g., $WO_2$, $WO_3$, $W_2O_3$, $W_2O_5$), molybdenum oxides (e.g., $MoO_2$, $MoO_3$), etc. In some embodiments, the layer 340 includes a conductive material. Examples of suitable conductive materials that can be used to form the layer 340 include Co, Cu, Ag, W, Mo, etc.

The deposition process can be any suitable deposition process. In some embodiments, the deposition process is an ALD process. In some embodiments, the deposition process is CVD process. The deposition process can utilize any suitable deposition precursors and any suitable process parameters. For example, if the layer 340 includes a metal oxide, then the deposition process can utilize a metal oxide precursor (e.g., metal alkoxide precursor). As another example, if the layer 340 includes a conductive material (e.g., metal), then the deposition process can utilize a conductive material precursor (e.g., metal precursor). The process parameters of the deposition process (e.g., ALD process or CVD process) can depend on the deposition precursor(s) used to form the layer 340, and the target thickness of the resulting layer 340.

Figure 3D:
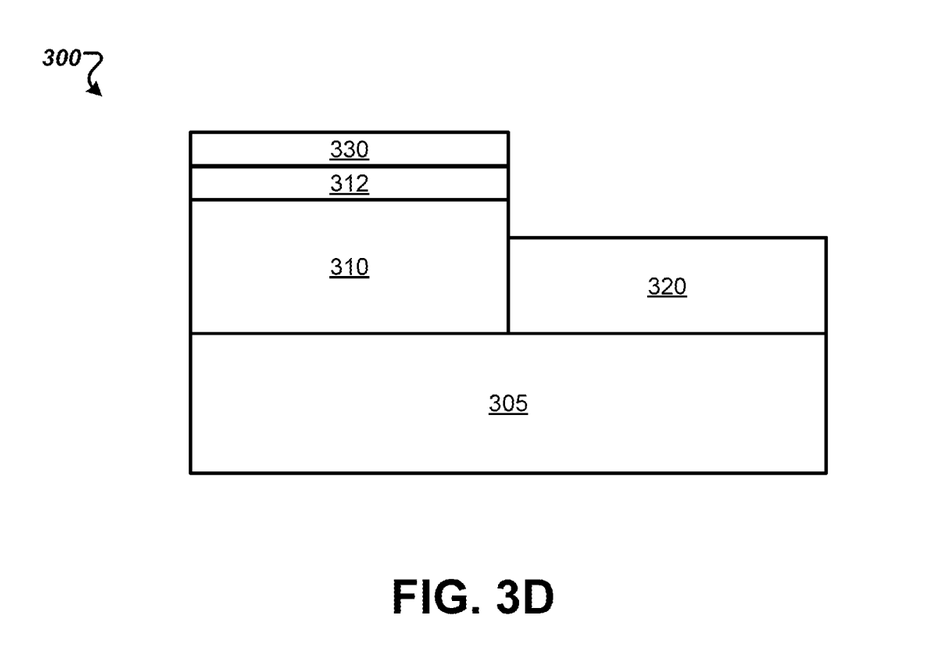

In some embodiments, and as shown in FIG. 3D, the at least one processing step includes etching the layer 320. The passivation layer 330 can be resistant to a particular etch chemistry used to etch the layer 320, which can provide suitable etch protection during etching of the layer 320. Further details regarding performing the at least one processing step are described above with reference to FIGS. 1-2.

In some embodiments, at least one cleaning process can be performed. For example, the at least one cleaning process can include a precleaning process performed prior to forming the passivation layer 330 and/or a post-cleaning process performed after the at least one processing step. Further details regarding performing the at least one cleaning process are described above with reference to FIGS. 1-2.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   forming a first layer and a second layer on a substrate;
   forming a passivation layer on a surface of the first layer without forming the passivation layer on a surface of the second layer by exposing the first layer and the second layer to a benzyl compound and causing catalytic polymerization of the benzyl compound using the first layer; and
   after forming the passivation layer on the first layer, performing at least one processing step with respect to the second layer selectively.

2. The method of claim 1, further comprising, prior to forming the passivation layer, performing a precleaning process to clean a surface of the first layer.

3. The method of claim 1, wherein performing the at least one processing step comprises depositing a third layer on the second layer, and wherein depositing the third layer on the second layer comprises using at least one of: an atomic layer deposition (ALD) process or a chemical vapor deposition (CVD) process.

4. The method of claim 1, wherein the passivation layer comprises poly (phenylene methylene) (PPM).

5. The method of claim 1, wherein the first layer comprises a transition metal oxide.

6. The method of claim 5, wherein the first layer comprises at least one of: a tungsten oxide, a molybdenum oxide, or a nickel oxide.

7. The method of claim 1, wherein the second layer comprises a dielectric layer.

8. The method of claim 7, wherein the second layer comprises at least one of: silicon dioxide, a carbon-doped silicon oxide, silicon nitride, a transition metal oxide, or a transition metal nitride.

9. The method of claim 1, wherein the second layer comprises a conductive material.

10. The method of claim 1, wherein performing the at least one processing step comprises depositing a third layer on the second layer, and wherein the third layer comprises a metal oxide or a metal nitride.

* * * * *